United States Patent [19]
Hanafusa et al.

[11] Patent Number: 5,465,259
[45] Date of Patent: Nov. 7, 1995

[54] LSI SYSTEM WITH A PLURALITY OF LSIS HAVING DIFFERENT SCAN SYSTEMS AND PROVIDED ON A PRINTED CIRCUIT BOARD

[75] Inventors: Akihiko Hanafusa, Yokohama; Toshihiko Tada, Kawasaki, both of Japan

[73] Assignee: Fujitsu Limited, Kanagawa, Japan

[21] Appl. No.: 104,852

[22] Filed: Aug. 12, 1993

[30] Foreign Application Priority Data

Aug. 14, 1992 [JP] Japan ................. 4-216939

[51] Int. Cl.$^6$ ............................... G05B 23/02
[52] U.S. Cl. .................. 371/22.3; 364/579; 364/580; 371/22.5
[58] Field of Search .................. 364/579, 580; 371/22.3, 22.5

[56] References Cited

U.S. PATENT DOCUMENTS

| | | | |
|---|---|---|---|
| 4,931,722 | 6/1990 | Stoica | 371/15.1 X |
| 5,029,166 | 7/1991 | Jarwala et al. | 371/22.3 X |
| 5,054,024 | 10/1991 | Whetsel | 371/22.3 |
| 5,056,093 | 10/1991 | Whetsel | 371/22.3 |
| 5,068,603 | 11/1991 | Mahoney | 371/22.3 X |
| 5,254,942 | 10/1993 | D'Souza et al. | 371/22.3 X |
| 5,312,277 | 6/1994 | Sparks et al. | 257/48 |

*Primary Examiner*—Edward R. Cosimano
*Attorney, Agent, or Firm*—Staas & Halsey

[57] ABSTRACT

An LSI system in which a plurality of LSIs having different scan systems are provided on an identical printed circuit board. The LSI system includes a common scan data-in terminal commonly provided for the plurality of LSIs on the printed circuit board, and a common scan data-out terminal commonly provided for the plurality of LSIs on the printed circuit board. The plurality of LSIs are classified into a plurality of groups, each group including at least one LSI having an identical scan system. Each LSI has a scan data-in pin and a scan data-out pin. Each group is connected in series or in parallel with each other, by way of the scan data-in pin and the scan data-out pin of the corresponding LSI, between the common scan data-in terminal and the common scan data-out terminal. By the above constitution, it is possible to decrease the number of external terminals to be provided on the printed circuit board for the scan operation. Also, it is possible to systematically take procedures for effecting the scan operation and thereby reduce time for the scan operation.

10 Claims, 9 Drawing Sheets

LSI SYSTEM WITH A PLURALITY OF LSIS HAVING DIFFERENT SCAN SYSTEMS AND PROVIDED ON A PRINTED CIRCUIT BOARD

BACKGROUND OF THE INVENTION

1. Field of the Invention

The present invention relates to an LSI system with a plurality of LSIs having different scan systems and provided on an identical printed circuit board. More particularly, it relates to a technique of connecting each scan system to each other in the LSI system.

2. Description of the Related Art

Conventionally, scan systems of various types have been employed to effect an operation or function test of an LSI. In a known scan system, the scan operation is carried out by connecting a group of flip-flops provided on an LSI in series with each other, inputting scan data from a scan data-in (SI) terminal allocated to an input pin of the LSI, and effecting a serial transfer of data through each flip-flop, for example, using two-phase clocks of A-phase and B-phase.

On the other hand, as another form different from the above scan system, LSIs which adopt a JTAG-Boundary Scan system (Standard-IEEE P1149.1) using two signals of a test clock (TCK) signal and a test mode select (TMS) signal have been recently increased.

The JTAG-Boundary Scan system (hereinafter simply referred to as "JTAG") includes, in addition to the above data scan system, a boundary scan system having a group of flip-flops (Boundary Scan Register, hereinafter referred to as "BS register") which are provided in the vicinity of input/output portions of an LSI and which are connected in series with each other, and an instruction register scan system having a group of flip-flops (Instruction Register, hereinafter referred to as "IR register") which are connected in series with each other and in which instructions for effecting a test are set. In the JTAG, the scan operation is carried out by selecting a test mode by a test mode select (TMS) signal, inputting scan data from a test data-in (TDI) terminal allocated to an input pin of the LSI to each scan system, and effecting a serial transfer of data through each flip-flop using a test clock (TCK).

Recently, there are often cases in that both LSIs having scan systems using the above two-phase (A/B) clocks (hereinafter referred to as "A/B-LSI") and LSIs having JTAGs (hereinafter referred to as "JTAG-LSI") are mounted on an identical printed circuit board. Namely, an LSI system in which LSIs having different scan systems are provided on a single printed circuit board has been developed.

However, in a known LSI system in which LSIs having different scan systems are provided on an identical printed circuit board, each scan system has been provided for the corresponding one of the LSIs, independently of other scan systems.

Accordingly, such an LSI system poses a number of problems in that: first, the number of external terminals to be provided on a printed circuit board for a scan operation is relatively increased; second, procedures for effecting the respective scan operations must be taken individually for each of the LSIs; and third, the procedures are complicated and thus it takes long time for the scan operation.

Note, the problems in the prior art will be explained later in detail in contrast with the preferred embodiments of the present invention.

SUMMARY OF THE INVENTION

An object of the present invention is to provide an LSI system in which it is possible to decrease the number of external terminals to be provided on a printed circuit board for a scan operation, and by which it is possible to systematically take procedures for effecting the scan operation and thereby reduce time for the scan operation.

According to the present invention, there is provided an LSI system in which a plurality of LSIs having different scan systems are provided on an identical printed circuit board, the LSI system including a common scan data-in terminal commonly provided for the plurality of LSIs on the printed circuit board, and a common scan data-out terminal commonly provided for the plurality of LSIs on the printed circuit board, the plurality of LSIs being classified into a plurality of groups, each group including at least one LSI having an identical scan system, each LSI having a scan data-in pin and a scan data-out pin, each group being connected in series or in parallel with each other, by way of the scan data-in pin and the scan data-out pin of the corresponding LSI, between the common scan data-in terminal and the common scan data-out terminal.

BRIEF DESCRIPTION OF THE DRAWINGS

Other objects and features of the present invention will be described hereinafter in detail by way of preferred embodiments with reference to the accompanying drawings, in which.

DESCRIPTION OF THE PREFERRED EMBODIMENTS

Throughout the description, identical references used in connection with the drawings indicate like constituent elements, and thus the repetition of explanation thereof is omitted.

First, for a better understanding of the preferred embodiments, the related prior art will be explained with reference to FIG. 1.

Figure 1:
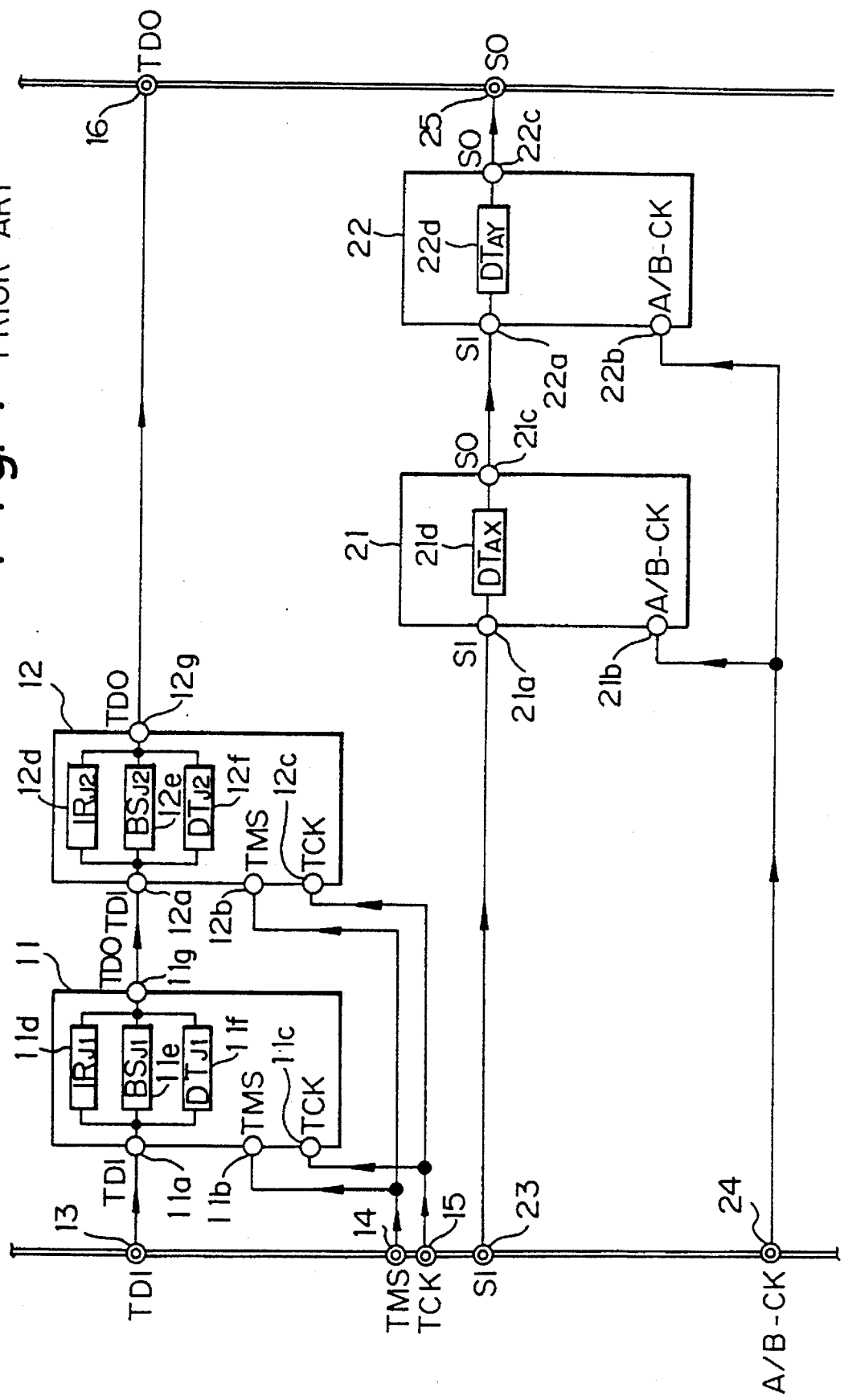
FIG. 1 is a diagram illustrating a constitution of a prior art LSI system.

FIG. 1 illustrates a constitution of a prior art LSI system. The illustrated LSI system includes a plurality of LSIs having different scan systems and provided on an identical printed circuit board.

In the illustration, references 11 and 12 denote JTAG-

LSIs, and references 21 and 22 denote A/B-LSIs.

Reference 13 denotes a test data-in (TDI) terminal provided on the printed circuit board; reference 14 a test mode select (TMS) terminal provided on the printed circuit board; reference 15 a test clock (TCK) terminal provided on the printed circuit board; reference 16 a test data-out (TDO) terminal provided on the printed circuit board; reference 23 a scan data-in (SI) terminal provided on the printed circuit board; reference 24 a two-phase clock (A/B-CK) terminal provided on the printed circuit board; and reference 25 a scan data-out (SO) terminal provided on the printed circuit board.

Also, references 11a and 12a denote TDI pins of the JTAG-LSIs 11 and 12; references 11b and 12b TMS pins of the JTAG-LSIs 11 and 12; references 11c and 12c TCK pins of the JTAG-LSIs 11 and 12; references 11g and 12g TDO pins of the JTAG-LSIs 11 and 12; references 21a and 22a SI pins of the A/B-LSIs 21 and 22; references 21b and 22b A/B-CK pins of the A/B-LSIs 21 and 22; and references 21c and 22c SO pins of the A/B-LSIs 21 and 22. Respective pins of the JTAG-LSIs 11, 12 and the A/B-LSIs 21, 22 are connected to the corresponding terminals of the printed circuit board, the corresponding signal output pin of the preceding LSI, or the corresponding signal input pin of the following LSI.

Also, references 11d and 12d denote instruction register chains (hereinafter referred to as "IR chain") of the JTAG-LSIs 11 and 12; references 11e and 12e boundary scan chains (hereinafter referred to as "BS chain") of the JTAG-LSIs 11 and 12; and references 11f and 12f data chains (hereinafter referred to as "DT chain") of the JTAG-LSIs 11 and 12. Which chain is selected among the three kinds of chain is determined by a select signal fed from the TMS pins 11b, 12b.

Also, references 21d and 22d denote DT chains of the A/B-LSIs 21 and 22, respectively.

In FIG. 1, when a scan system for the JTAG-LSIs 11, 12 is operated, a TMS signal is first input from the TMS terminal 14 of the printed circuit board. The TMS signal is fed to the TMS pins 11b, 12b of the JTAG-LSIs 11, 12, to thereby set the test mode of each LSI.

Next, when a test data is input from the TDI terminal 13 and a test clock is input from the TCK terminal 15, the test clock is fed via the TCK pins 11c, 12c to the JTAG-LSIs 11, 12. Also, the test data is fed to the TDI pin 11a of the JTAG-LSI 11, and thus a scan operation is carried out with respect to a test mode (i.e., IR chain 11d, BS chain 11e, or DT chain 11f) selected by the TMS signal.

The test data input to the TDI pin 11a of the JTAG-LSI 11 is output via the selected chain to the TDO pin 11g thereof, and thus input to the TDI pin 12a of the JTAG-LSI 12. In the same way as the above, the JTAG-LSI 12 effects a scan operation according to the input test data, and outputs the test data to the TDO pin 12g thereof. The TDO signal (test data) is output to the TDO terminal 16 of the printed circuit board.

On the other hand, when a scan system for the A/B-LSIs 21, 22 is operated, a scan data is input from the SI terminal 23 and two-phase (A/B) clocks are input from the A/B-CK terminal 24.

When the scan data is fed to the SI pin 21a of the A/B-LSI 21, the A/B-LSI 21 responds to the two-phase (A/B) clocks fed to the A/B-CK pin 21b thereof and effects a scan operation of the DT chain 21d.

The scan data input to the SI pin 21a of the A/B-LSI 21 is output via the DT chain to the SO pin 21c thereof, and thus input to the SI pin 22a of the A/B-LSI 22. In the same way as the above, the A/B-LSI 22 effects a scan operation of the DT chain 22d according to the input scan data, and outputs the scan data to the SO pin 22c thereof. The SO signal (scan data) is output to the SO terminal 25 of the printed circuit board.

As explained above, in the prior art LSI system in which the JTAG-LSIs and the A/B-LSIs are provided on the identical printed circuit board, the scan system for the JTAG-LSIs and the scan system for the A/B-LSIs have been provided independently of each other.

Accordingly, a problem occurs in that the number of external terminals to be provided on the printed circuit board for the scan operation is relatively increased. Also, another problem occurs in that it is necessary to take procedures for effecting the respective scan operations, individually for each of the LSIs. Furthermore, a disadvantage arises in that the procedures are complicated and thus it takes long time for the scan operation.

Figure 2:
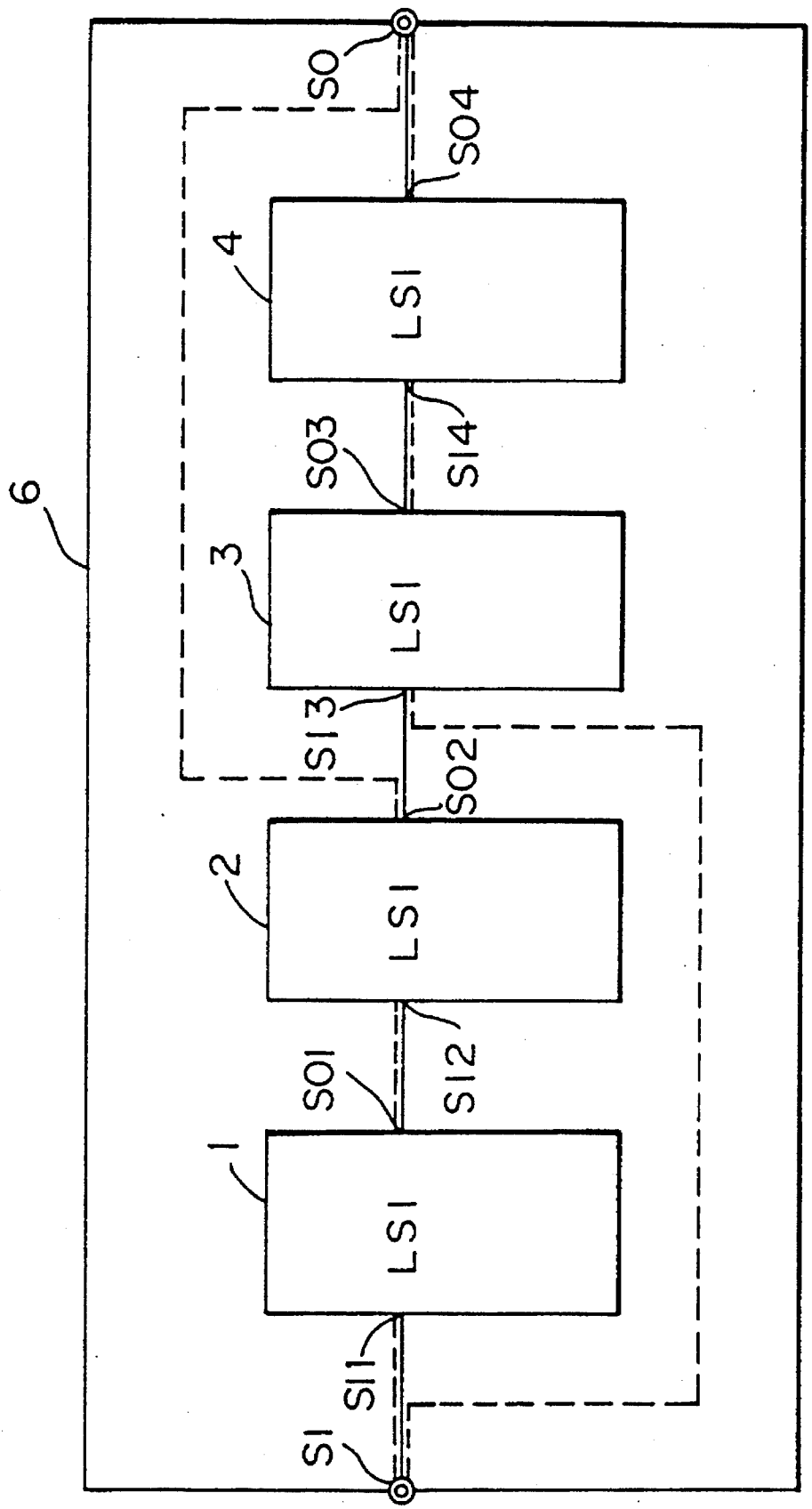
FIG. 2 is a block diagram illustrating the fundamental constitution of the LSI system according to the present invention.

FIG. 2 illustrates the fundamental constitution of the LSI system according to the present invention.

In the illustrated LSI system, a plurality of LSIs (in the example, four LSIs 1, 2, 3 and 4) having different scan systems are provided on an identical printed circuit board 6. The LSI system includes a common scan data-in terminal SI commonly provided for the LSIs 1 to 4 on the printed circuit board 6, and a common scan data-out terminal SO commonly provided for the LSIs 1 to 4 on the printed circuit board 6. The LSIs 1 to 4 are classified into a plurality of groups (in the example, two groups), each group including at least one LSI (1, 2; 3, 4) having an identical scan system. Each LSI has a scan data-in pin SI1, SI2, SI3, SI4 and a scan data-out pin SO1, SO2, SO3, SO4. Each group is connected in series (indicated by solid lines) or in parallel (indicated by broken lines) with each other, by way of the scan data-in pin and the scan data-out pin of the corresponding LSI, between the common scan data-in terminal SI and the common scan data-out terminal SO.

According to the above constitution, since each group including at least one LSI is connected in series or in parallel with each other between the common scan data-in terminal SI and the common scan data-out terminal SO, it is possible to relatively decrease the number of external terminals to be provided on the printed circuit board 6 for each scan operation. Also, it is possible to systematically take procedures for effecting each scan operation and thus reduce time required for the scan operation.

Figures 3A, 3B:
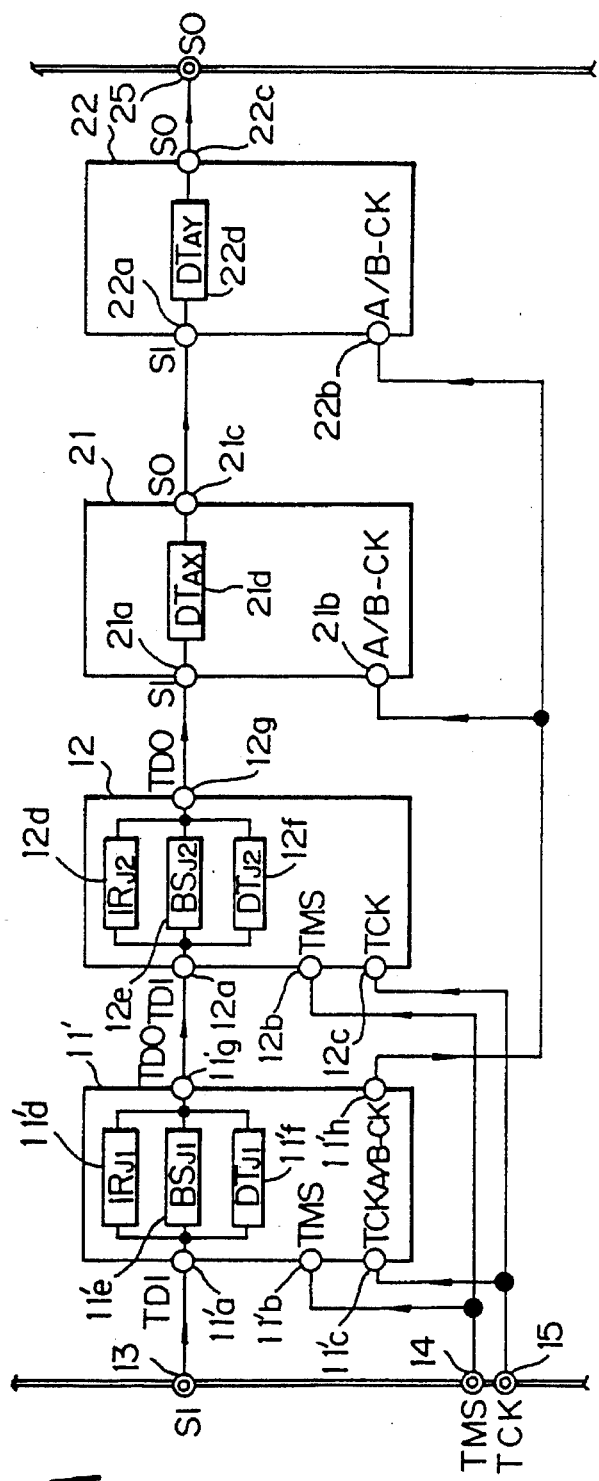
FIGS. 3A and 3B are diagrams illustrating a first embodiment of the present invention.

FIGS. 3A and 3B illustrate a first embodiment of the present invention.

In the present embodiment, a JTAG-LSI 11' is provided in place of the JTAG-LSI 11 shown in FIG. 1. The JTAG-LSI 11' has a circuit (not shown) capable of generating two-phase (A/B) clocks in synchronization with the test clock (TCK), and an A/B-CK pin 11'h. The generated A/B clock is fed from the A/B-CK pin 11'h to each of the A/B-LSIs 21 and 22.

Note, in the illustration, "prime (')" is affixed to each reference of the input/output pins and the respective chains of the JTAG-LSI 11'.

In the constitution of FIG. 3A, where each scan system for the JTAG-LSIs 11', 12 and the A/B-LSIs 21, 22 is operated, a TMS signal is input from the TMS terminal 14 in the same way as the prior art, and thereby each test mode of the JTAG-LSIs 11' and 12 is determined.

Next, a scan data is input from the SI terminal 13 and a test clock is input from the TCK terminal 15. Thus, the test clock is fed to the TCK pins 11'c and 12c of the JTAG-LSIs 11' and 12. On the other hand, the scan data is fed to the TDI pin 11'a of the JTAG-LSI 11', and thus a scan operation is carried out with respect to a test mode (i.e., IR chain 11'd, BS chain 11'e, or DT chain 11'f) selected by the TMS signal. Also, the JTAG-LSI 11' generates the two-phase (A/B) clocks in synchronization with the test clock (TCK), and outputs the two-phase clocks to the A/B-CK pin 11'h.

The scan data input to the TDI pin 11'a of the JTAG-LSI 11' is output via the selected chain to the TDO pin 11'g thereof, and thus input to the TDI pin 12a of the JTAG-LSI 12. In the same way as the above, the JTAG-LSI 12 effects a scan operation according to the input scan data, and outputs the scan data to the TDO pin 12g thereof.

The TDO signal (scan data) output from the JTAG-LSI 12 is fed to the SI pin 21a of the A/B-LSI 21. The A/B-LSI 21 receives the two-phase (A/B) clocks from the JTAG-LSI 11' at the A/B-CK pin 21b thereof. When the scan data is input to the SI pin 21a, the A/B-LSI 21 effects a scan operation of the DT chain 21d.

The scan data input to the SI pin 21a of the A/B-LSI 21 is output via the DT chain to the SO pin 21c thereof, and thus input to the SI pin 22a of the A/B-LSI 22. In the same way as the above, the A/B-LSI 22 effects a scan operation of the DT chain 22d according to the input scan data, and outputs the scan data to the SO pin 22c thereof. The SO signal (scan data) is output to the SO terminal 25 of the printed circuit board.

FIG. 3B shows the relationship between each scan system in FIG. 3A and the respective chain lengths in operation of each scan system.

In FIG. 3B, reference JTAG denotes the JTAG-LSI 11' or 12, and references AX and AY denote the A/B-LSIs 21 and 22, respectively. Also, references IR, BS and DT denote the IR chain, the BS chain and the DT chain, respectively; references IR, BS and DT with suffixes "J1", "J2", and the like, denote the respective chain lengths; and references J1, J2, AX and AY denote the respective chains of the JTAG-LSIs 11', 12 and the A/B-LSIs 21, 22. Furthermore, the mark "○" indicates the case that a scan operation is carried out with respect to flip-flops included in the chain concerned, and the mark "×" indicates the case that such a scan operation is not carried out.

As shown in FIGS. 3A and 3B, where a scan operation is carried out with respect to the IR chains 11'd and 12d of the JTAG-LSIs 11' and 12, the chain length is "$IR_{J1}+IR_{J2}+DT_{AX}+DT_{AY}$". Also, where a scan operation is carried out with respect to the BS chains 11'e and 12e of the JTAG-LSIs 11' and 12, the chain length is "$BS_{J1}+BS_{J2}+DT_{AX}+DT_{AY}$". Likewise, where a scan operation is carried out with respect to the DT chains 11'f and 12f of the JTAG-LSIs 11' and 12, the chain length is "$DT_{J1}+DT_{J2}+DT_{AX}+DT_{AY}$".

Also, as is obvious from FIG. 3B, the number of chains in the present embodiment is three, i.e., "(11'd)→(12d)→(21d)→(22d)", "(11'e)→(12e)→(21 d)→(22d)", and "(11'f)→(12f)→(21d)→(22d)". This number of chains is equal to the maximum number of chains in each JTAG-LSI 11', 12.

Furthermore, in the present embodiment, the DT chains 21d and 22d of the A/B-LSIs 21 and 22 are provided commonly to the above three chains. Accordingly, when a scan operation is carried out with respect to the IR chain or the BS chain of the JTAG-LSIs 11' and 12, it is necessary to take into consideration the respective DT chain lengths of the A/B-LSIs 21 and 22.

Figures 4A, 4B:
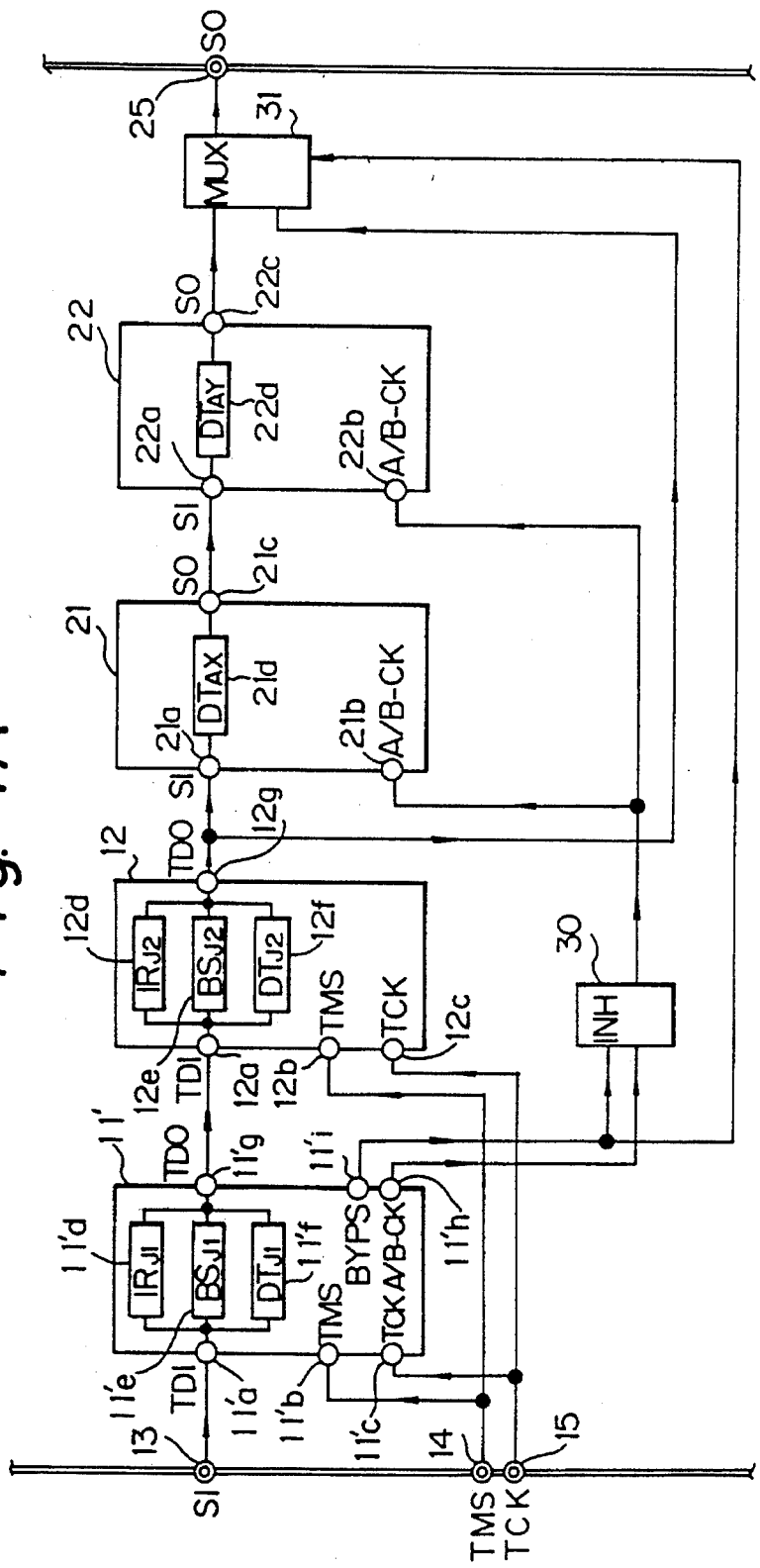
FIGS. 4A and 4B are diagrams illustrating a second embodiment of the present invention.

FIGS. 4A and 4B illustrate a second embodiment of the present invention.

In the same manner as in the first embodiment, the two-phase (A/B) clocks are fed from the JTAG-LSI 11' to each of the A/B-LSIs 21 and 22.

The present embodiment is constituted such that an inhibit circuit 30 and a multiplexer 31 are added to the constitution of the first embodiment, and such that the JTAG-LSI 11' is provided with a bypass (BYPS) pin 11'i for generating a bypass signal. By the constitution, when a scan operation is carried out with respect to the IR chain or the BS chain of the JTAG-LSIs 11' and 12, the JTAG-LSI 11' sets a bypass flag to be ON and outputs the bypass signal from the BYPS pin 11'i, to thereby bypass the A/B-LSIs 21 and 22.

Note, other constitution and the operation thereof are the same as those in the first embodiment, and thus the explanation thereof is omitted.

Referring to FIG. 4A, where a scan operation is carried out with respect to the IR chain or the BS chain of the JTAG-LSIs 11' and 12, the bypass flag of the JTAG-LSI 11' is first set to be ON and the bypass signal is then output from the BYPS pin 11'i. The inhibit circuit 30 is brought to a "closed" state upon receipt of the bypass signal, and thus the supply of the two-phase (A/B) clocks to the A/B-LSIs 21 and 22 is inhibited. Also, the multiplexer 31 selects the TDO signal (scan data) of the JTAG-LSI 12 and outputs the selected signal to the SO terminal 25 of the printed circuit board.

Therefore, in this case, the TDO signal (scan data) of the JTAG-LSI 12 bypasses the A/B-LSIs 21 and 22, and is output to the SO terminal 25.

On the other hand, where a scan operation is carried out with respect to the DT chain of the JTAG-LSIs 11' and 12, the bypass flag of the JTAG-LSI 11' is set to be OFF. As a result, the inhibit circuit 30 is brought to an "open" state, and thus the two-phase (A/B) clocks are fed to the A/B-LSIs 21 and 22. Also, the multiplexer 31 selects the SO signal (scan data) of the A/B-LSI 22 and outputs the selected signal to the SO terminal 25 of the printed circuit board.

Therefore, in this case, the TDO signal (scan data) of the JTAG-LSI 12 is output via the A/B-LSIs 21 and 22 to the SO terminal 25.

FIG. 4B shows the relationship between each scan system in FIG. 4A and the respective chain lengths in operation of each scan system. In FIG. 4B, reference BYPS denotes the set state of the bypass flag. Other references are the same as those in FIG. 3B, and thus the explanation thereof is omitted.

In the present embodiment, the number of chains is three, which is equal to the maximum number of chains in each JTAG-LSI 11', 12, as in the first embodiment. Also, the DT chains 21d and 22d of the A/B-LSIs 21 and 22 are provided without depending on the above three chains. Accordingly, when a scan operation is carried out with respect to the IR chain or the BS chain of the JTAG-LSIs 11' and 12, it is not necessary to take into consideration the respective DT chain lengths of the A/B-LSIs 21 and 22.

Although, in the second embodiment, the bypass signal is fed from the BYPS pin 11'i of the JTAG-LSI 11', it may be fed, for example, from an external terminal of the printed circuit board.

Figures 5A, 5B:
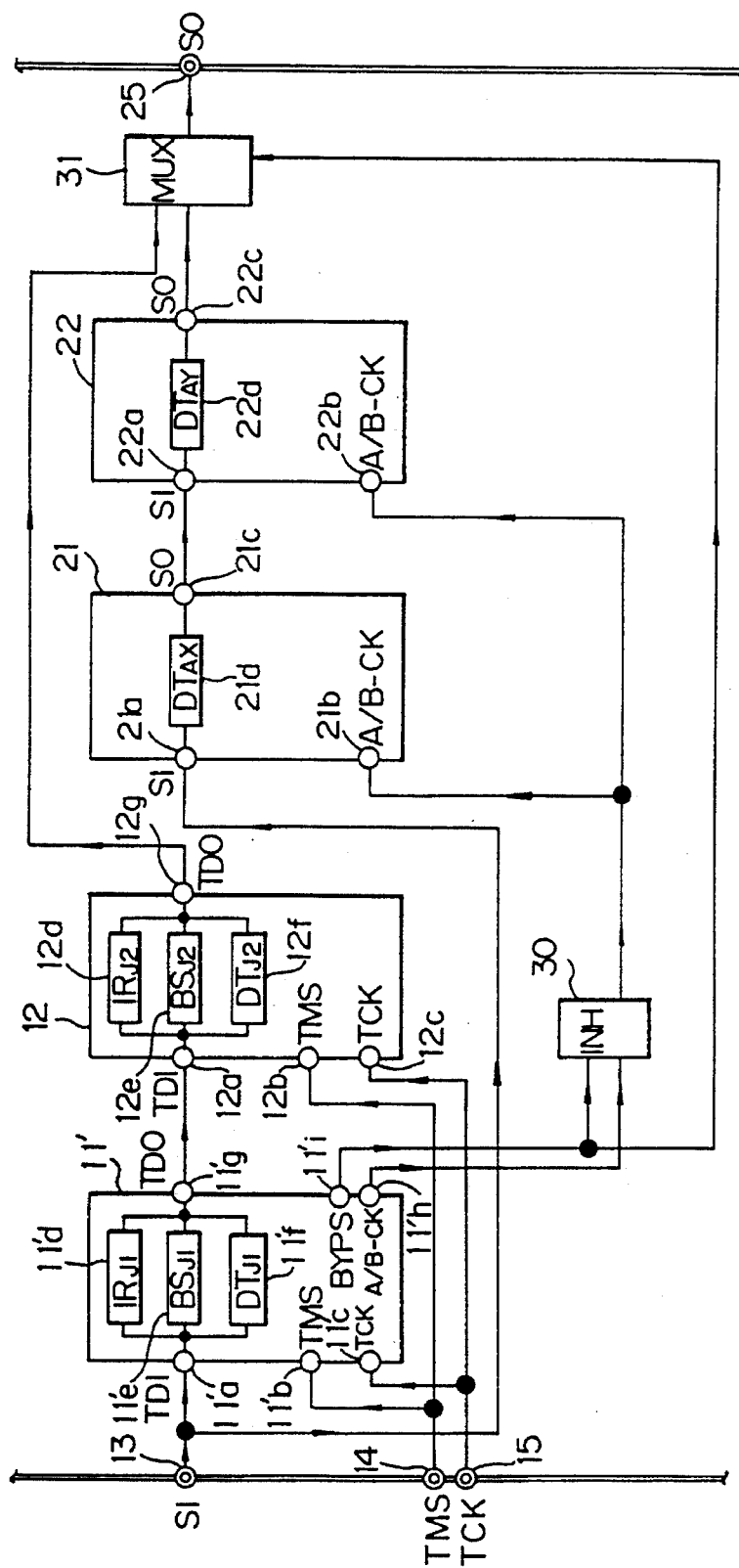
FIGS. 5A and 5B are diagrams illustrating a third embodiment of the present invention.

FIGS. 5A and 5B illustrate a third embodiment of the present invention.

In the same manner as in the first embodiment, the two-phase (A/B) clocks are fed from the JTAG-LSI 11' to each of the A/B-LSIs 21 and 22.

The present embodiment is constituted such that, when a scan operation is carried out with respect to the IR chain, BS chain, or DT chain of the JTAG-LSIs 11' and 12, the bypass flag of the JTAG-LSI 11' is set and thus each DT chain of the A/B-LSIs 21 and 22 is "skipped", and such that, when the bypass flag is not set, a scan operation is carried out with respect to each DT chain of the A/B-LSIs 21 and 22 independently of each chain of the JTAG-LSIs 11' and 12.

Other constitution and the operation thereof are the same as those in the second embodiment shown in FIGS. 4A and 4B.

In FIG. 5A, where a scan operation is carried out with respect to the IR chain, BS chain, or DT chain of the JTAG-LSIs 11' and 12, the bypass flag of the JTAG-LSI 11' is set and thus the bypass signal is output from the BYPS pin 11'i. The inhibit circuit 30 is brought to a closed state upon receipt of the bypass signal, and thus the supply of the A/B clock to the A/B-LSIs 21 and 22 is inhibited. Also, the multiplexer 31 selects the TDO signal (scan data) of the JTAG-LSI 12 and outputs the selected signal to the SO terminal 25 of the printed circuit board.

Therefore, in this case, the TDO signal (scan data) of the JTAG-LSI 12 skips the A/B-LSIs 21 and 22, and is output to the SO terminal 25.

On the other hand, where the bypass flag is not set, the inhibit circuit 30 is brought to an open state, and thus the A/B clock is fed to the A/B-LSIs 21 and 22. Also, the multiplexer 31 selects the SO signal (scan data) of the A/B-LSI 22 and outputs the selected signal to the SO terminal 25 of the printed circuit board.

Therefore, in this case, the scan data input to the SI terminal 13 of the printed circuit board is directly fed to the SI pin 21a of the A/B-LSI 21, and then output via the A/B-LSIs 21 and 22 to the SO terminal 25.

FIG. 5B shows the relationship between each scan system in FIG. 5A and the respective chain lengths in operation of each scan system. References shown in FIG. 5B are the same as those in FIG. 4B, and thus the explanation thereof is omitted.

In the present embodiment, the number of chains is three (which is equal to the maximum number of chains in each JTAG-LSI 11', 12) plus one (which is the DT chain in each A/B-LSI 21, 22). Also, the DT chains 21d and 22d of the A/B-LSIs 21 and 22 are provided without depending on the three chains in each JTAG-LSI 11', 12. Accordingly, when a scan operation is carried out with respect to the IR chain or the BS chain of the JTAG-LSIs 11' and 12, it is not necessary to take into consideration the respective DT chain lengths of the A/B-LSIs 21 and 22.

Although, in the third embodiment, the bypass signal is fed from the BYPS pin 11'i of the JTAG-LSI 11', it may be fed, for example, from an external terminal of the printed circuit board.

Figures 6A, 6B:
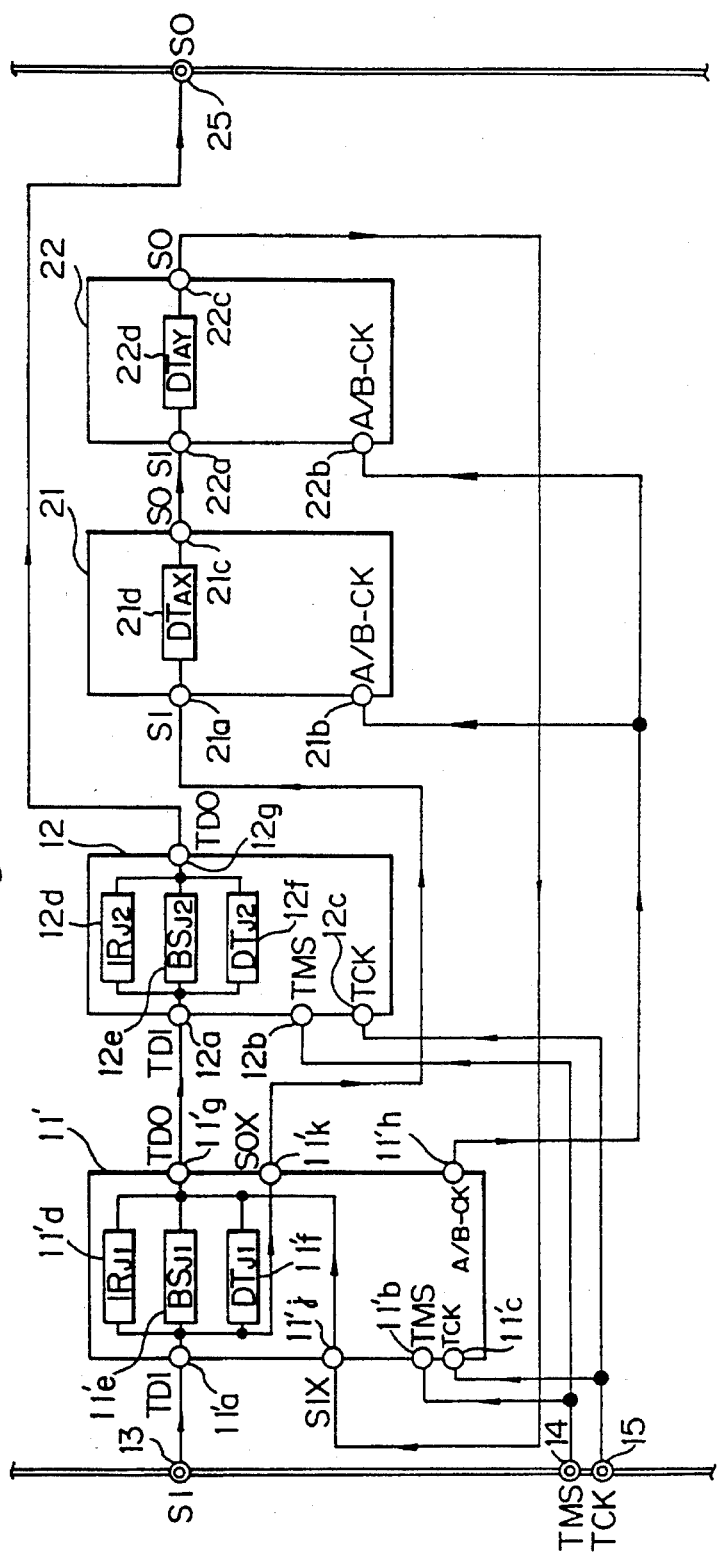
FIGS. 6A and 6B are diagrams illustrating a fourth embodiment of the present invention.

FIGS. 6A and 6B illustrate a fourth embodiment of the present invention.

In the same manner as in the first embodiment, the two-phase (A/B) clocks are fed from the JTAG-LSI 11' to each of the A/B-LSIs 21 and 22.

In the present embodiment, the JTAG-LSI 11' has a scan data-in (SIX) pin 11'j and a scan data-out (SOX) pin 11'k, and is constituted such that a scan data input to the SIX pin 11'j is output to the TDO pin 11'g and a scan data input to the TDI pin 11'a is output to the SOX pin 11'k. Namely, the entire circuit is constituted such that each chain of the A/B-LSIs 21 and 22 appears to form part of the JTAG-LSI 11'.

Other constitution and the operation thereof are the same as those in the first embodiment shown in FIGS. 3A and 3B, and thus the explanation thereof is omitted.

In FIG. 6A, where a scan operation is carried out with respect to the IR chain, BS chain, or DT chain of the JTAG-LSIs 11' and 12, the JTAG-LSI 11' first inhibits the supply of the A/B clock to the A/B-LSIs 21 and 22, and then inputs a scan data from the TDI pin 11'a thereof.

The scan data input to the TDI pin 11'a is output via the IR chain, BS chain, or DT chain to the TDO pin 11'g of the JTAG-LSI 11'.

The scan data output to the TDO pin 11'g is input to the TDI pin 12a of the JTAG-LSI 12, and in the same way as the above, output via the IR chain, BS chain, or DT chain to the TDO pin 12g of the JTAG-LSI 12, and then output to the SO terminal 25 of the printed circuit board.

On the other hand, where a scan operation is carried out with respect to each DT chain of the A/B-LSIs 21 and 22, the JTAG-LSI 11' supplies the A/B clock to the A/B-LSIs 21 and 22, and inactivates the IR chain, BS chain, and DT chain thereof.

When a scan data is input from the TDI pin 11'a of the JTAG-LSI 11', it is directly output to the SOX pin 11'k of the JTAG-LSI 11', and then input to the SI pin 21a of the A/B-LSI 21.

The scan data input to the SI pin 21a is output via each DT chain of the A/B-LSIs 21 and 22 to the SO pin 22e of the A/B-LSI 22, and then input to the SIX pin 11'j of the JTAG-LSI 11'. The scan data is further fed via the TDO pin 11'g of the JTAG-LSI 11' to the TDI pin 12a of the JTAG-LSI 12. The scan data bypasses the JTAG-LSI 12 and is output to the TDO pin 12g of the JTAG-LSI 12, and then output to the SO terminal 25 of the printed circuit board.

According to the constitution of the present embodiment, it is possible to systematically treat the entire scan system as the scan system only for JTAG-LSIs.

FIG. 6B shows the relationship between each scan system in FIG. 6A and the respective chain lengths in operation of each scan system. References shown in FIG. 6B are the same as those in FIG. 3B, and thus the explanation thereof is omitted.

In the present embodiment, the number of chains is three (which is equal to the maximum number of chains in each JTAG-LSI 11', 12) plus one (which is the DT chain in each A/B-LSI 21, 22). Also, the DT chains 21d and 22d of the A/B-LSIs 21 and 22 are provided without depending on the three chains in each JTAG-LSI 11', 12. Accordingly, when a scan operation is carried out with respect to the IR chain or the BS chain of the JTAG-LSIs 11' and 12, it is not necessary to take into consideration the respective DT chain lengths of the A/B-LSIs 21 and 22.

Figures 7A, 7B:
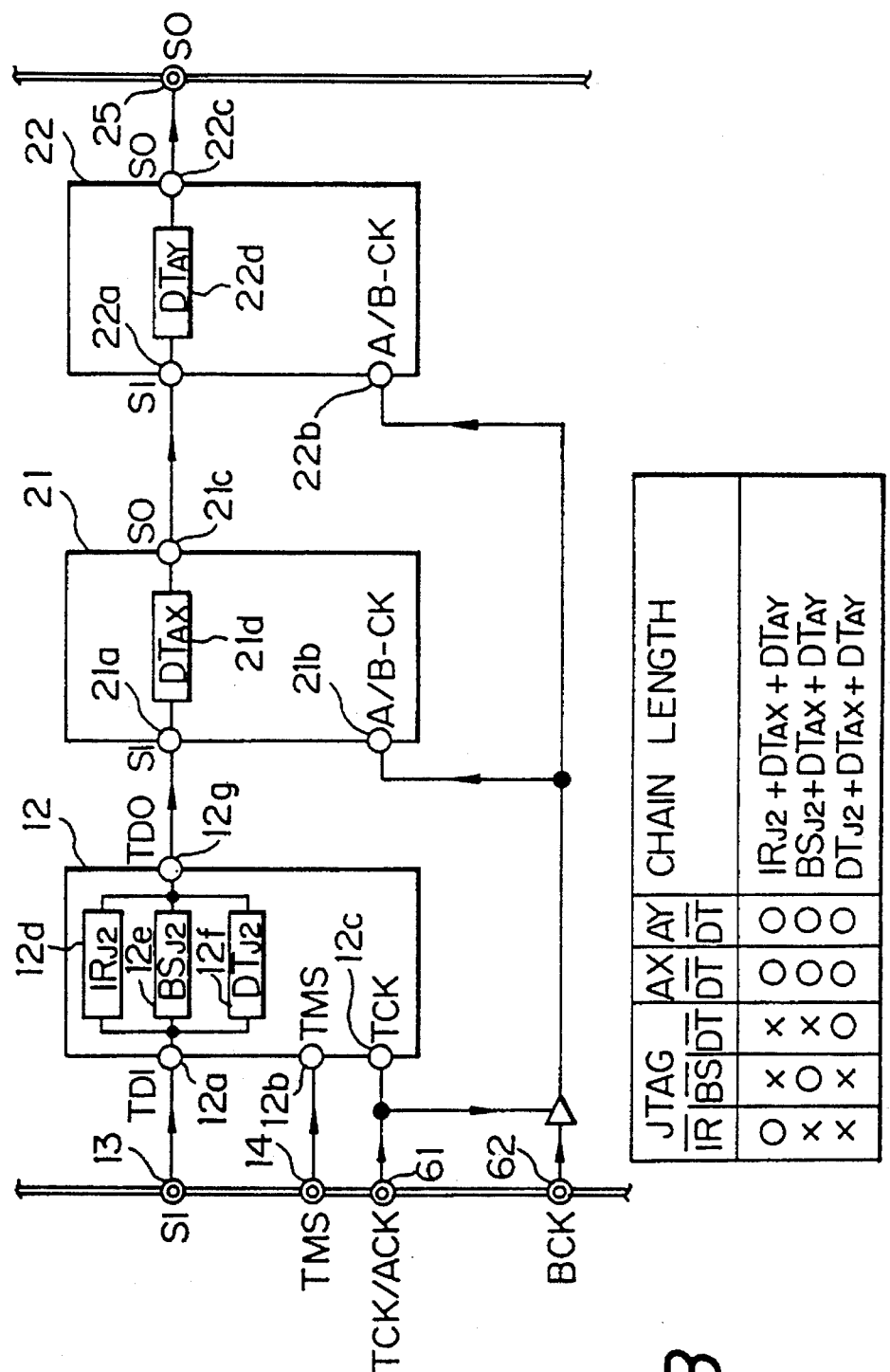
FIGS. 7A and 7B are diagrams illustrating a fifth embodiment of the present invention.

FIGS. 7A and 7B illustrate a fifth embodiment of the present invention.

Compared with the first embodiment (see FIGS. 3A and 3B), the JTAG-LSI 11' having the function of generating the two-phase (A/B) clocks is removed. Instead, the present embodiment is constituted such that an A-phase clock (ACK) for common use with the test clock (TCK) is generated in the outside of the printed circuit board and fed via a TCK/ACK terminal 61 to the inside thereof, and such that a B-phase clock (BCK) is generated in the outside of the printed circuit board and fed via a BCK terminal 62 to the inside thereof.

Other constitution and the operation thereof are the same as those in the first embodiment (FIGS. 3A and 3B), and thus the explanation thereof is omitted.

Figures 8A, 8B:
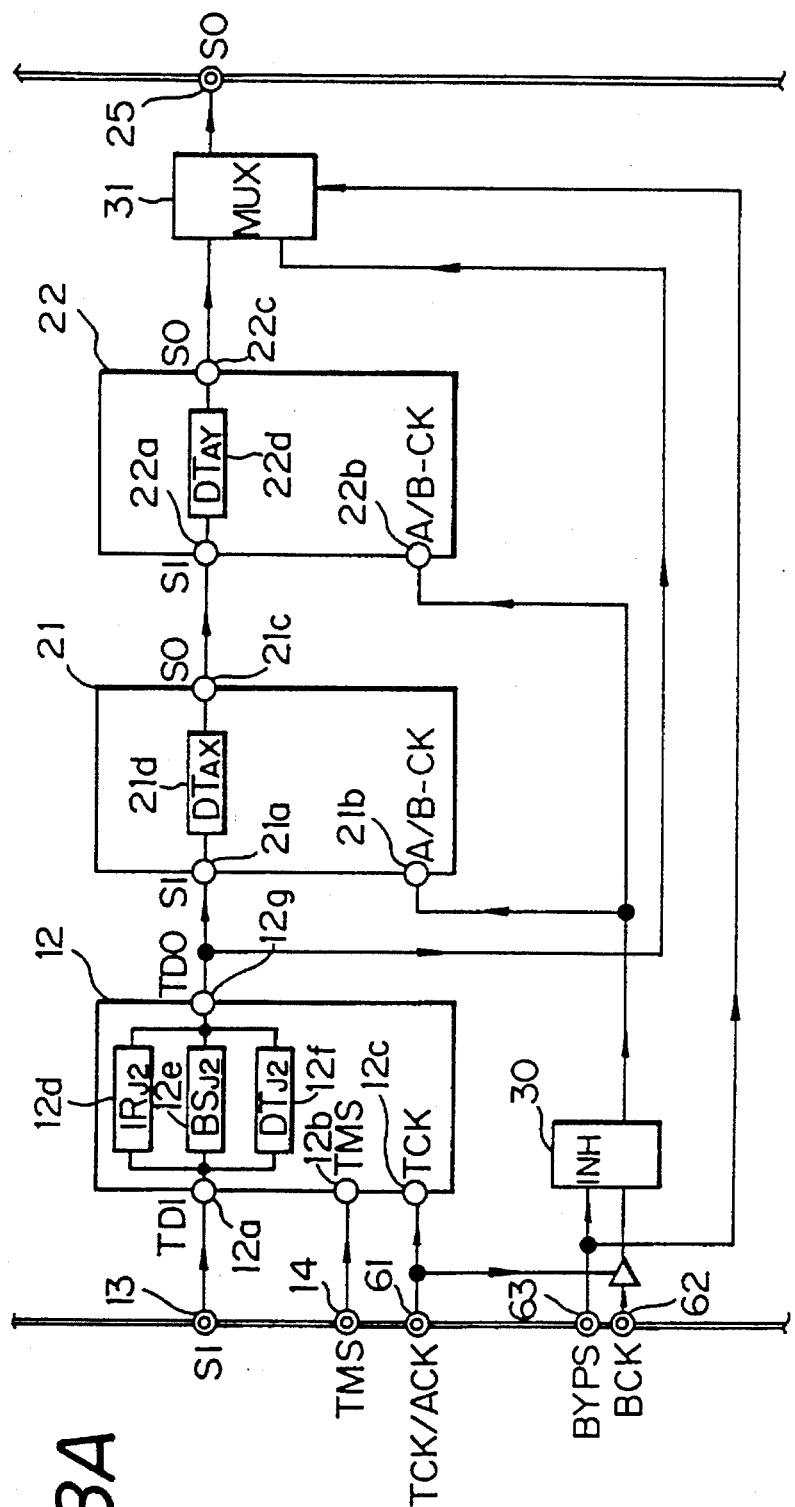
FIGS. 8A and 8B are diagrams illustrating a sixth embodiment of the present invention.

FIGS. 8A and 8B illustrate a sixth embodiment of the present invention.

Compared with the second embodiment (see FIGS. 4A and 4B), the JTAG-LSI 11' having the function of generating the two-phase (A/B) clocks is removed. Instead, the present embodiment is constituted such that both an A-phase clock (ACK) for common use with the test clock (TCK) and a B-phase clock (BCK) are generated in the outside of the printed circuit board and fed via a TCK/ACK terminal 61 and a BCK terminal 62, respectively, to the inside thereof, and such that the bypass signal is generated in the outside of the printed circuit board and fed via a BYPS terminal 63 to the inside thereof.

Other constitution and the operation thereof are the same as those in the second embodiment (FIGS. 4A and 4B), and thus the explanation thereof is omitted.

Figures 9A, 9B:
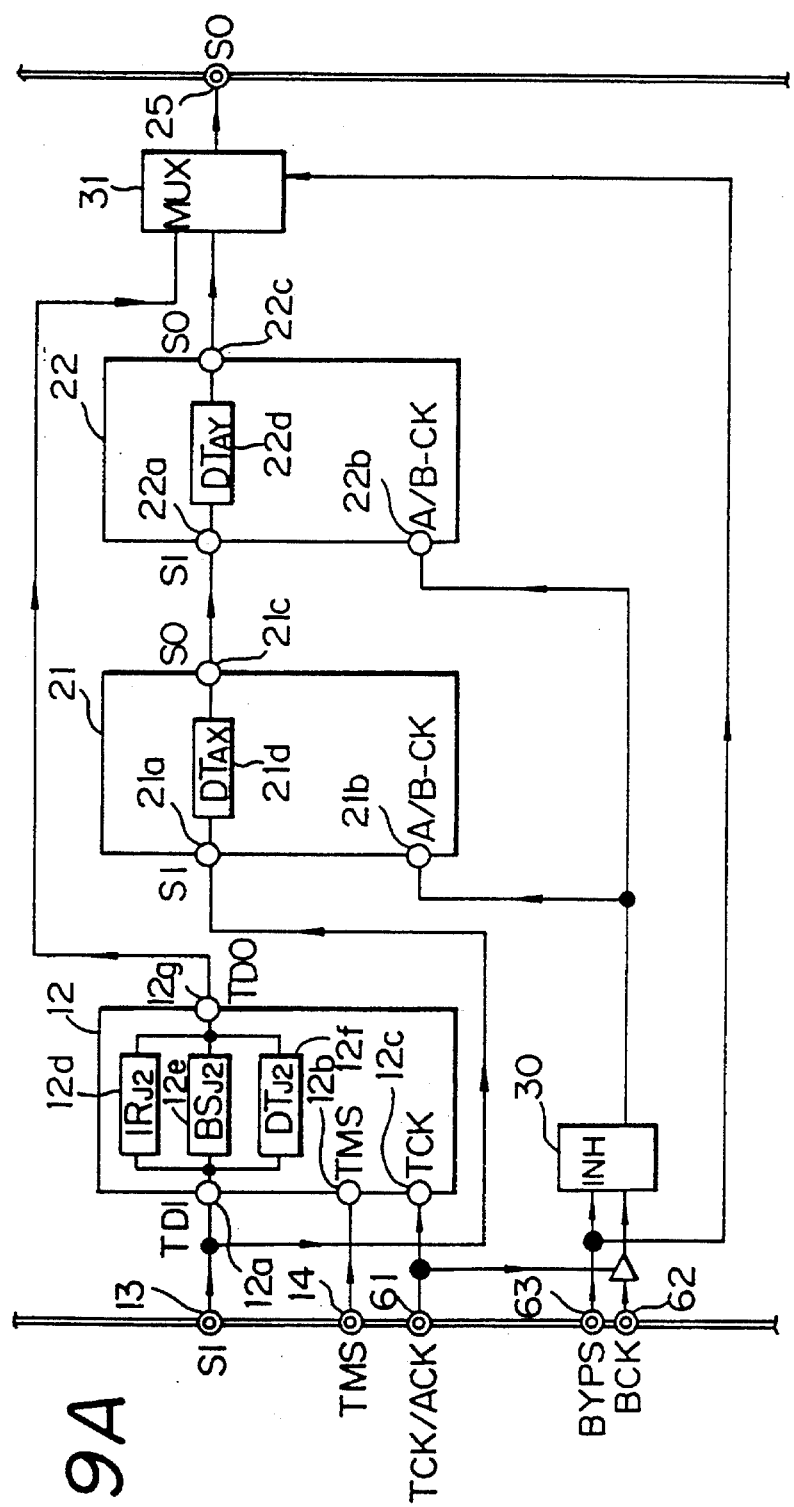
FIGS. 9A and 9B are diagrams illustrating a seventh embodiment of the present invention.

FIGS. 9A and 9B illustrate a seventh embodiment of the present invention.

Compared with the third embodiment (see FIGS. 5A and 5B), the JTAG-LSI 11' having the function of generating the two-phase (A/B) clocks is removed. Instead, the present embodiment is constituted such that both an A-phase clock (ACK) for common use with the test clock (TCK) and a B-phase clock (BCK) are generated in the outside of the printed circuit board and fed via a TCK/ACK terminal 61 and a BCK terminal 62, respectively, to the inside thereof, and such that the bypass signal is generated in the outside of the printed circuit board and fed via a BYPS terminal 63 to the inside thereof.

Other constitution and the operation thereof are the same as those in the third embodiment (FIGS. 5A and 5B), and thus the explanation thereof is omitted.

Although, in the fifth, sixth, and seventh embodiments, the A-phase clock (ACK) and the B-phase clock (BCK) are fed from the outside of the printed circuit board, the two-phase (A/B) clocks can be generated inside the printed circuit board in the same way as in the first, second, and third embodiments. Likewise, the bypass signal can be generated inside the printed circuit board as in the second and third embodiments.

Although the present invention has been disclosed and described by way of several embodiments, it is apparent to those skilled in the art that other embodiments and modifications of the present invention are possible without departing from the spirit or essential features thereof.

We claim:

1. An LSI system in which at least one JTAG-LSI and at least one A/B-LSI are provided on the same printed circuit board, the at least one JTAG-LSI performing a scan operation in accordance with scan data, a test clock signal and a test mode select signal and the at least one A/B-LSI performing a scan operation in accordance with scan data and two-phase clock signals, the LSI system comprising:

a common scan data-in terminal which is provided on the printed circuit board and receives scan data into the LSI system;

a common scan data-out terminal which is provided on the printed circuit board and outputs scan data from the LSI system;

a first external terminal which is provided on the printed circuit board and receives the test clock signal;

a second external terminal which is provided on the printed circuit board and receives the test mode select signal;

a first group comprising at least one JTAG-LSI, each JTAG-LSI of the first group comprising
a scan system which uses the test clock signal received by the first external terminal and the test mode select signal received by the second external terminal, the scan system of each JTAG-LSI in the first group being identical,
a scan data-in pin which receives scan data into the respective JTAG-LSI,
a scan data-out pin which outputs scan data from the respective JTAG-LSI, and
a plurality of chains which are individually selectable by the test mode select signal, a scan operation being performed with respect to a selected chain, the plurality of chains including an instruction register chain, a boundary scan chain and a data chain; and a second group comprising at least one A/B-LSI, the first group and the second group being connected in one of a series connection and a parallel connection between the common scan data-in terminal and the common scan data-out terminal, each A/B-LSI of the second group comprising
a scan system which uses two-phase clock signals and is different from the respective scan systems of the at least one JTAG-LSI in the first group, the respective scan system of each A/B-LSI of the second group being identical,
a scan data-in pin which receives scan data into the respective A/B-LSI,
a scan data-out pin which outputs scan data from the respective A/B-LSI, and
a data chain, a scan operation being performed with respect to the data chain, wherein the first group comprises a plurality of JTAG-LSIs cascaded together via the respective scan data-in pins and the respective scan data-out pins to connect a first JTAG-LSI to a last JTAG-LSI with scan data received in the respective scan data-in pin of a first JTAG-LSI, transferred through the respective JTAG-LSIs, and output from the respective scan data-out pin of the last JTAG-LSI, the second group comprises a plurality of A/B-LSIs cascaded together via the respective scan data-in pins and the respective scan data-out pins to connect a first A/B-LSI to a last A/B-LSI with scan data received in the respective scan data-in pin of the first A/B-LSI, transferred through the respective A/B-LSIs and output from the respective scan data-out pin of the last A/B-LSI, the first group and the second group are connected in series with each other between the common scan data-in terminal and the common scan data-out terminal, and the first group includes a JTAG-LSI which generates a bypass control signal and the two-phase clock signals in synchronization with the test clock signal, the LSI system further comprising
an inhibit circuit which receives the bypass control signal and supplies the two-phase clock signals to each A/B-LSI in the second group in accordance with the bypass control signal and
a multiplexer which receives the bypass control signal, the output of the scan data-out pin of the last JTAG-LSI in the first group and the output of the scan data-out pin of the last A/B-LSI in the second group, and selects one of the output of the last JTAG-LSI in the first group and the output of the last A/B-LSI in the second group, and provides the selected output to the common scan data-out terminal.

2. An LSI system as set forth in claim 1, wherein, when a scan operation is performed with respect to one of the instruction register chain and the boundary scan chain of each JTAG-LSI in the first group, the inhibit circuit inhibits the supply of the two-phase clock signals to each A/B-LSI of the second group, and the multiplexer selects the output of the last JTAG-LSI in the first group.

3. An LSI system as set forth in claim 1, wherein, when a scan operation is performed with respect to the data chain of each JTAG-LSI in the first group, the inhibit circuit supplies the two-phase clock signals to each A/B-LSI of the second group, and the multiplexer selects the output of the last A/B-LSI in the second group.

4. An LSI system in which at least one JTAG-LSI and at least one A/B-LSI are provided on the same printed circuit board, the at least one JTAG-LSI performing a scan operation in accordance with scan data, a test clock signal and a test mode select signal and the at least one A/B-LSI performing a scan operation in accordance with scan data and two-phase clock signals, the LSI system comprising:

a common scan data-in terminal which is provided on the printed circuit board and receives scan data into the LSI system;

a common scan data-out terminal which is provided on the printed circuit board and outputs scan data from the LSI system;

a first external terminal which is provided on the printed circuit board and receives the test clock signal;

a second external terminal which is provided on the printed circuit board and receives the test mode select signal;

a first group comprising at least one JTAG-LSI, each JTAG-LSI of the first group comprising a scan system which uses the test clock signal received by the first external terminal and the test mode select signal received by the second external terminal, the scan system of each JTAG-LSI in the first group being identical, a scan data-in pin which receives scan data into the respective JTAG-LSI, a scan data-out pin which outputs scan data from the respective JTAG-LSI, and a plurality of chains which are individually selectable by the test mode select signal, a scan operation being performed with respect to a selected chain, the plurality of chains including an instruction register chain, a boundary scan chain and a data chain; and a second group comprising at least one A/B-LSI, the first group and the second group being connected in one of a series connection and a parallel connection between the common scan data-in terminal and the common scan data-out terminal, each A/B-LSI of the second group comprising a scan system which uses two-phase clock signals and is different from the respective scan systems of the at least one JTAG-LSI in the first group, the respective scan system of each A/B-LSI of the second group being identical, a scan data-in pin which receives scan data into the respective A/B-LSI, a scan data-out pin which outputs scan data from the respective A/B-LSI, and a data chain, a scan operation being performed with respect to the data chain, wherein the first group comprises a plurality of JTAG-LSIs cascaded together via the respective scan data-in pins and the respective scan data-out pins to connect a first JTAG-LSI to a last JTAG-LSI with scan data received in the respective scan data-in pin of the first JTAG-LSI, transferred through the respective JTAG-LSIs, and output from the respective scan data-out pin of the last JTAG-LSI, the second group comprising a plurality of A/B-LSIs cascaded together via the respective scan data-in pins and the respective scan data-out pins to connect a first A/B-LSI to a last A/B-LSI with scan data received in the respective scan data-in pin of the first A/B-LSI, transferred through the respective A/B-LSIs and output from the respective scan data-out pin of the last A/B-LSI, the first group and the second group are connected in parallel with each other between the common scan data-in terminal and the common scan data-out terminal, and the first group includes a JTAG-LSI which generates a bypass control signal and two-phase clock signals in synchronization with the test clock signal, the LSI system further comprising an inhibit circuit which receives the bypass control signal and supplies the two-phase clock signals to each A/B-LSI in the second group in accordance with the bypass control signal, and a multiplexer which receives the bypass control signal, the output of the scan data-out pin of the last JTAG-LSI in the first group and the output of the scan data-out pin of the last A/B-LSI in the second group, and selects one of the output of the last JTAG-LSI in the first group and the output of the last A/B-LSI in the second group, and provides the selected output to the common scan data-out terminal.

5. An LSI system as set forth in claim 4, wherein a scan operation with respect to the selected chain of each JTAG-LSI in the first group and a scan operation with respect to the data chain of each A/B-LSI in the second group are performed independently of each other.

6. An LSI system as set forth in claim 5, wherein, when a scan operation is performed with respect to one of the instruction register chain, the boundary scan chain and the data chain of each JTAG-LSI in the first group, the inhibit circuit inhibits the supply of the two-phase clock signals to each A/B-LSI of the second group, and the multiplexer selects the output of the last JTAG-LSI in the first group.

7. An LSI system as set forth in claim 5, wherein, when a scan operation is performed with respect to the data chain of each A/B-LSI in the second group, the inhibit circuit supplies the two-phase clock signals to each A/B-LSI in the second group, and the multiplexer selects the output of the last A/B-LSI in the second group.

8. An LSI system in which at least one JTAG-LSI and at least one A/B-LSI are provided on the same printed circuit board, the at least one JTAG-LSI performing a scan operation in accordance with scan data, a test clock signal and a test mode select signal and the at least one A/B-LSI performing a scan operation in accordance with scan data and two-phase clock signals, the LSI system comprising:

a common scan data-in terminal which is provided on the printed circuit board and receives scan data into the LSI system;

a common scan data-out terminal which is provided on the printed circuit board and outputs scan data from the LSI system;

a first external terminal which is provided on the printed circuit board and receives the test clock signal;

a second external terminal which is provided on the printed circuit board and receives the test mode select signal;

a first group comprising at least one JTAG-LSI, each
JTAG-LSI of the first group comprising
  a scan system which uses the test clock signal received
  by the first external terminal and the test mode select
  signal received by the second external terminal, the
  scan system of each JTAG-LSI in the first group
  being identical,
  a scan data-in pin which receives scan data into the
  respective JTAG-LSI,
  a scan data-out pin which outputs scan data from the
  respective JTAG-LSI, and
  a plurality of chains which are individually selectable
  by the test mode select signal, a scan operation being
  performed with respect to a selected chain, the
  plurality of chains including an instruction register
  chain, a boundary scan chain and a data chain; and
a second group comprising at least one A/B-LSI, the first
group and the second group being connected in one of
a series connection and a parallel connection between
the common scan data-in terminal and the common
scan data-out terminal, each A/B-LSI of the second
group comprising
  a scan system which uses two-phase clock signals and
  is different from the respective scan systems of the at
  least one JTAG-LSI in the first group, the respective
  scan system of each A/B-LSI of the second group
  being identical,
  a scan data-in pin which receives scan data into the
  respective A/B-LSI,
  a scan data-out pin which outputs scan data from the
  respective A/B-LSI, and
  a data chain, a scan operation being performed with
  respect to the data chain,
wherein the first group comprises a plurality of JTAG-
  LSIs cascaded together via the respective scan data-in
  pins and the respective scan data-out pins to connect a
  first JTAG-LSI to a last JTAG-LSI with scan data
  received in the respective scan data-in pin of the first
  JTAG-LSI, transferred through the respective JTAG-
  LSIs, and output from the respective scan data-out pin
  of the last JTAG-LSI, the second group comprising a
  plurality of A/B-LSIs cascaded together via the respec-
  tive scan data-in pins and the respective scan data-out
  pins to connect a first A/B-LSI to a last A/B-LSI with
  scan data received in the respective scan data-in pin of
  the first A/B-LSI, transferred through the respective
  A/B-LSIs and output from the respective scan data-out
  pin of the last A/B-LSI, the first group and the second
  group are connected in parallel with each other between
  the common scan data-in terminal and the common
  scan data-out terminal, and the first group includes a
  clock generating JTAG-LSI which generates two-phase
  clock signals in synchronization with the test clock
  signal, the two-phase signals being fed to each A/B-LSI
  of the second group, the clock generating JTAG-LSI
  having a first pin which receives the output of the scan
  data-out pin of the last A/B-LSI in the second group and
  transfers the received output to the scan data-out pin of
  the clock generating JTAG-LSI, and a second pin
  which receives scan data provided to the scan data-in
  pin of the clock generating JTAG-LSI and transfers the
  received scan data to the scan data-in pin of the first
  A/B-LSI in the second group.

9. An LSI system in which at least one JTAG-LSI and at
least one A/B-LSI are provided on the same printed circuit
board, the at least one JTAG-LSI performing a scan opera-
tion in accordance with scan data, a test clock signal and a
test mode select signal and the at least one A/B-LSI per-
forming a scan operation in accordance with scan data and
two-phase clock signals, the LSI system comprising:
  a common scan data-in terminal which is provided on the
  printed circuit board and receives scan data into the LSI
  system;
  a common scan data-out terminal which is provided on
  the printed circuit board and outputs scan data from the
  LSI system;
  a first external terminal which is provided on the printed
  circuit board and receives the test clock signal;
  a second external terminal which is provided on the
  printed circuit board and receives the test mode select
  signal;
  a first group comprising at least one JTAG-LSI, each
  JTAG-LSI of the first group comprising
    a scan system which uses the test clock signal received
    by the first external terminal and the test mode select
    signal received by the second external terminal, the
    scan system of each JTAG-LSI in the first group
    being identical,
    a scan data-in pin which receives scan data into the
    respective JTAG-LSI,
    a scan data-out pin which outputs scan data from the
    respective JTAG-LSI, and
    a plurality of chains which are individually selectable
    by the test mode select signal, a scan operation being
    performed with respect to a selected chain, the
    plurality of chains including an instruction register
    chain, a boundary scan chain and a data chain; and
  a second group comprising at least one A/B-LSI, the
  first group and the second group being connected in
  one of a series connection and a parallel connection
  between the common scan data-in terminal and the
  common scan data-out terminal, each A/B-LSI of the
  second group comprising
    a scan system which uses two-phase clock signals and
    is different from the respective scan systems of the at
    least one JTAG-LSI in the first group, the respective
    scan system of each A/B-LSI of the second group
    being identical,
    a scan data-in pin which receives scan data into the
    respective A/B-LSI,
    a scan data-out pin which outputs scan data from the
    respective A/B-LSI, and
    a data chain, a scan operation being performed with
    respect to the data chain,
  wherein the first group comprising a plurality of JTAG-
    LSIs cascaded together via the respective scan data-in
    pins and the respective scan data-out pins to connect a
    first JTAG-LSI to a last JTAG-LSI with scan data
    received in the respective scan data-in pin of a first
    JTAG-LSI, transferred though the respective JTAG-
    LSIs, and output from the respective scan data-out pin
    of the last JTAG-LSI, the second group comprising a
    plurality of A/B-LSIs cascaded together via the respec-
    tive scan data-in pins and the respective scan data-out
    pins to connect a first A/B-LSI to a last A/B-LSI with
    scan data received in the respective scan data-pin of the
    first A/B-LSI, transferred though the respective A/B-
    LSIs and output from the respective scan data-out pin
    of the last A/B-LSI, the two-phase clock signals com-
    prising an A-phase clock signal and a B-phase clock
    signal, the first group and the second group are con-
    nected in series with each other between the common
    scan data-in terminal and the common scan data-out terminal, the LSI system further comprising
a third external terminal which receives the B-phase clock signal, the A-phase clock signal being common to the test clock signal,
a fourth external terminal which receives a bypass control signal,
an inhibit circuit which receives the bypass control signal from the fourth external terminal and supplies the two-phase clocks to each A/B-LSI of the second group in accordance with the bypass control signal, and
a multiplexer which receives the bypass control signal, the output of the scan data-out pin of the last JTAG-LSI in the first group and the output of the scan data-out pin of the last A/B-LSI in the second group, and selects one of the output of the last JTAG-LSI in the first group and the output of the last A/B-LSI in the second group, and provides the selected output signal to the common scan data-out terminal.

10. An LSI system in which at least one JTAG-LSI and at least one A/B-LSI are provided on the same printed circuit board, the at least one JTAG-LSI performing a scan operation in accordance with scan data, a test clock signal and a test mode select signal and the at least one A/B-LSI performing a scan operation in accordance with scan data and two-phase clock signals, the LSI system comprising:

a common scan data-in terminal which is provided on the printed circuit board and receives scan data into the LSI system;

a common scan data-out terminal which is provided on the printed circuit board and outputs scan data from the LSI system;

a first external terminal which is provided on the printed circuit board and receives the test clock signal;

a second external terminal which is provided on the printed circuit board and receives the test mode select signal;

a first group comprising at least one JTAG-LSI, each JTAG-LSI of the first group comprising
a scan system which uses the test clock signal received by the first external terminal and the test mode select signal received by the second external terminal, the scan system of each JTAG-LSI in the first group being identical,
a scan data-in pin which receives scan data into the respective JTAG-LSI,
a scan data-out pin which outputs scan data from the respective JTAG-LSI, and
a plurality of chains which are individually selectable by the test mode select signal, a scan operation being performed with respect to a selected chain, the plurality of chains including an instruction register chain, a boundary scan chain and a data chain; and a second group comprising at least one A/B-LSI, the first group and the second group being connected in one of a series connection and a parallel connection between the common scan data-in terminal and the common scan data-out terminal, each A/B-LSI of the second group comprising
a scan system which uses two-phase clock signals and is different from the respective scan systems of the at least one JTAG-LSI in the first group, the respective scan system of each A/B-LSI of the second group being identical,
a scan data-in pin which receives scan data into the respective A/B-LSI,
a scan data-out pin which outputs scan data from the respective A/B-LSI, and
a data chain, a scan operation being performed with respect to the data chain, wherein the first group comprises a plurality of JTAG-LSIs cascaded together via the respective scan data-in pins and the respective scan data-out pins to connect a first JTAG-LSI to a last JTAG-LSI with scan data received in the respective scan data-in pin of a first JTAG-LSI, transferred through the respective JTAG-LSIs and output from the respective scan data-out pin of the last JTAG-LSI, the second group comprises a plurality of A/B-LSIs cascaded together via the respective scan data-in pins and the respective scan data-out pins to connect a first A/B-LSI to a last A/B-LSI with scan data received in the respective scan data-in pin of the first A/B-LSI, transferred through the respective A/B-LSIs and output from the respective scan data-out pin of the last A/B-LSI, the two-phase clock signals comprising an A-phase clock signal and a B-phase clock signal, the first group and the second group are connected in parallel with each other between the common scan data-in terminal and the common scan data-out terminal, the LSI system further comprising
a third external terminal which receives the B-phase clock signal, the A-phase clock signal being common to the test clock signal,
a fourth external terminal which receives a bypass control signal,
an inhibit circuit which receives the bypass control signal from the fourth external terminal and supplies the two-phase clock signals to each A/B-LSI of the second group in accordance with the bypass control signal, and
a multiplexer which receives the bypass control signal, the output of the scan data-out pin of the last JTAG-LSI in the first group and the output of the scan data-out pin of the last A/B-LSI in the second group, and selects one of the output of the last JTAG-LSI in the first group and the output of the last A/B-LSI in the second group, and provides the selected output to the common scan data-out terminal.

* * * * *

UNITED STATES PATENT AND TRADEMARK OFFICE
CERTIFICATE OF CORRECTION

PATENT NO. : 5,465,259
DATED : November 7, 1995
INVENTOR(S) : Akihiko HANAFUSA et al.

It is certified that error appears in the above-indentified patent and that said Letters Patent is hereby corrected as shown below:

Column 5, line 57, change "(21 d)" to --(21d)--.

Signed and Sealed this

Twenty-seventh Day of February, 1996

Attest:

BRUCE LEHMAN

Attesting Officer     Commissioner of Patents and Trademarks